US009378838B2

(12) United States Patent
Tran et al.

(10) Patent No.: US 9,378,838 B2
(45) Date of Patent: Jun. 28, 2016

(54) MIXED VOLTAGE NON-VOLATILE MEMORY INTEGRATED CIRCUIT WITH POWER SAVING

(71) Applicant: Silicon Storage Technology, Inc., San Jose, CA (US)

(72) Inventors: Hieu Van Tran, San Jose, CA (US); Anh Ly, San Jose, CA (US); Thuan Vu, San Jose, CA (US); Hung Quoc Nguyen, Fremont, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 14/257,335

(22) Filed: Apr. 21, 2014

(65) Prior Publication Data
US 2014/0226409 A1 Aug. 14, 2014

Related U.S. Application Data

(62) Division of application No. 13/286,969, filed on Nov. 1, 2011, now Pat. No. 8,705,282.

(51) Int. Cl.
G11C 16/04 (2006.01)
G11C 16/30 (2006.01)
G11C 5/14 (2006.01)
G11C 16/08 (2006.01)
G11C 11/56 (2006.01)

(52) U.S. Cl.
CPC ............. *G11C 16/30* (2013.01); *G11C 5/147* (2013.01); *G11C 16/08* (2013.01); *G11C 11/5628* (2013.01)

(58) Field of Classification Search
CPC .................. H01L 2224/48247; G11C 16/30; G11C 5/147
See application file for complete search history.

(56) References Cited

U.S. PATENT DOCUMENTS

| 5,103,425 A | 4/1992 | Kuo et al. |
| 5,519,654 A * | 5/1996 | Kato ............... G11C 16/10 327/532 |
| 5,646,890 A | 7/1997 | Lee |
| 5,661,690 A | 8/1997 | Roohparvar |

(Continued)

FOREIGN PATENT DOCUMENTS

| CN | 101258597 A | 9/2008 |
| JP | 02-097058 | 4/1990 |

(Continued)

OTHER PUBLICATIONS

Linear Technology, "High Efficiency Inductorless Step-Down DC/DC Converters", Feb. 28, 2011, Linear Technology Corporation, Datasheet LTC1503-1.8/LTC1503-2, pp. 1-17.*

(Continued)

*Primary Examiner* — Son Dinh
*Assistant Examiner* — Uyen B Tran
(74) *Attorney, Agent, or Firm* — DLA Piper LLP (US)

(57) ABSTRACT

An integrated circuit die has a first die pad for receiving a first voltage and a second die pad for receiving a second voltage. The second voltage is less than the first voltage and is generated by a voltage regulator that receives the first voltage. A first circuit which is operable at the first voltage is in the integrated circuit die. A second circuit which is operable at the second voltage is in the integrated circuit die and is connected to the second die pad. The voltage regulator is enabled by a controller.

20 Claims, 14 Drawing Sheets

(56) References Cited

U.S. PATENT DOCUMENTS

| | | | |
|---|---|---|---|
| 6,005,802 | A | 12/1999 | Takeuchi |
| 6,097,641 | A | 8/2000 | Lu et al. |
| 7,057,230 | B2 | 6/2006 | Tanaka |
| 7,430,149 | B2 | 9/2008 | Yoshiaga |
| 7,590,003 | B2 | 9/2009 | Jo et al. |
| 7,751,250 | B2 | 7/2010 | Lee |
| 7,864,615 | B2 | 1/2011 | Chen |
| 7,944,314 | B2 * | 5/2011 | Zhu .................. H03K 5/1565 315/307 |
| 2002/0012272 | A1 * | 1/2002 | Shukuri et al. ........... 365/185.24 |
| 2002/0191469 | A1 * | 12/2002 | Honma et al. ................ 365/226 |
| 2005/0001681 | A1 | 1/2005 | Chen |
| 2005/0201169 | A1 | 9/2005 | Demange et al. |
| 2005/0258474 | A1 | 11/2005 | Tanaka |
| 2006/0203556 | A1 | 9/2006 | Chen |
| 2007/0047365 | A1 | 3/2007 | Yoshiaga |
| 2007/0257313 | A1 | 11/2007 | Hidaka et al. |
| 2008/0159036 | A1 | 7/2008 | Leung |
| 2009/0224823 | A1 | 9/2009 | Gyohten et al. |
| 2009/0245009 | A1 | 10/2009 | Keeth et al. |
| 2009/0323421 | A1 | 12/2009 | Lee |
| 2010/0008175 | A1 * | 1/2010 | Sweere ............... G06F 12/0866 365/229 |
| 2010/0128551 | A1 | 5/2010 | Tanzawa et al. |

FOREIGN PATENT DOCUMENTS

| | | |
|---|---|---|
| JP | 03-110650 | 5/1991 |
| JP | 04-205887 | 7/1992 |
| JP | 06-084996 | 3/1994 |
| JP | 07-29386 | 1/1995 |
| JP | 10-144079 | 5/1998 |
| JP | 2001-266572 | 9/2001 |
| WO | 02-082460 A1 | 10/2002 |

OTHER PUBLICATIONS

PCT Search Report and Written Opinion dated Jan. 4, 2013 corresponding to the related PCT Patent Application No. US12/59808.

Japanese Office Action dated Apr. 22, 2015 corresponding to the related Japanese Patent Application No. 2014-539966.

Chinese Office Action dated May 19, 2015 corresponding to the related Chinese Patent Application No. 201280065657.5.

* cited by examiner

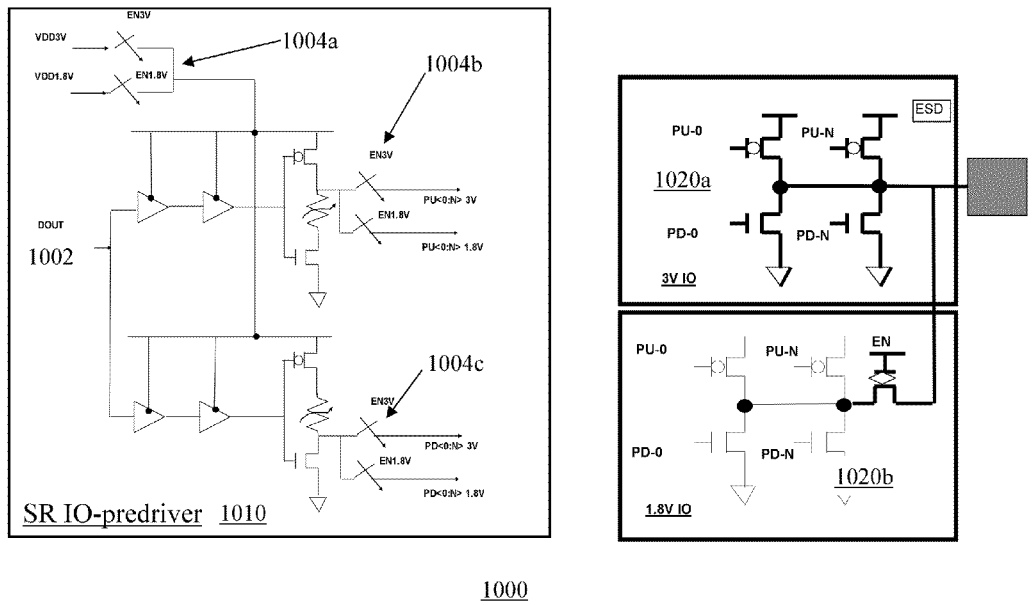

Figure 14

| Power Operating Table I | | | | | | | |
|---|---|---|---|---|---|---|---|
| Mode | VDD for Sense | VDD for CHPMP | VDD for Logic Controller on | VDD for XDEC | VDD for IOBUF | VDD for YDEC | VDDREG18V output |
| Standby | 0V | 0V | 3V/1.8V | 1.8V/3V | 3V | 1.8V/3V | 1.8V |
| Deep Power down | 0V | 0V | 3V/1.3-1.6V | 0V | 3V | 0V | 1.3-1.6V |
| Read | 1.8V/3V | 0V | 3V/1.8V | 1.8V | 3V | 1.8V/3V | 1.8V |
| Program | 0V | 3V | 3V/1.8V | 1.8V | 3V | 1.8V/3V | 1.8V |
| Erase | 0V | 3V | 3V/1.8V | 1.8V | 3V | 1.8V/3V | 1.8V |

| Power Operating Table II | | | | | | | |
|---|---|---|---|---|---|---|---|
| Mode | VDD for SA | VDD for CHPMP | VDD for Logic Controller on | VDD for XDEC | VDD for IOBUF | VDD for YDEC | VDDREG18V |
| Standby | 0V | 0V | 1.8V | 1.8V | 1.8V | 0V | 1.8V |
| Deep Power down | 0V | 0V | 1.8V | 0V | 1.8V | 0V | 1.0-1.3V |
| Read | 1.8V | 0V | 1.8V | 1.8V | 1.8V | 1.8V | 1.8V |
| Program | 0V | 1.8V | 1.8V | 1.8V | 1.8V | 1.8V | 1.8V |
| Erase | 0V | 1.8V | 1.8V | 1.8V | 1.8V | 1.8V | 1.8V |

Figure 15

MIXED VOLTAGE NON-VOLATILE MEMORY INTEGRATED CIRCUIT WITH POWER SAVING

CROSS REFERENCE TO RELATED APPLICATIONS

This application is a divisional of U.S. application Ser. No. 13/286,969, filed on Nov. 1, 2011, and issued on Apr. 22, 2014 as U.S. Pat. No. 8,705,282, which is incorporated herein by reference.

TECHNICAL FIELD

The present invention relates to an integrated circuit die for receiving a plurality of different voltages and more particularly wherein the die has the capability to save power.

BACKGROUND OF THE INVENTION

Integrated circuit dies that use different voltages are well known in the art. Referring to FIG. 1 there is shown a block diagram of a flash (non-volatile) memory integrated circuit die 10 of the prior art. The flash memory circuit die 10 comprises a flash memory array 100, having a plurality of flash memory cells arranged in a plurality of rows and columns. A microcontroller 20 controls the operation of the flash array 100 through an address bus, a data bus and a control bus. Finally, a mixed IP circuit 30 controls both the microcontroller 20 and the array 100 through a mixed signal bus. In a typical operation, the microcontroller 20 is supplied with a voltage source of 3.0 volts, while the flash array 100 is supplied with a voltage source of 1.8 volts. The 1.8 volt source is generated by the mixed IP circuit 30 using a DC-DC converter based upon an externally supplied 3.0 volt source. In addition, the externally supplied 3.0 volt source is also supplied to the microcontroller 20.

Referring to FIG. 2 there is shown a schematic block level circuit diagram 60 of a portion of the flash memory circuit die 10 shown in FIG. 1. The circuit diagram has a die pad 21 connected through bond wire 51 to a bond pad 41 for receiving the externally supplied 3.0 volts. The externally supplied 3.0 volts is then supplied in the die 10 to IO buffer circuit 36, and to other well known circuits, such as TTL circuit 34 (converting input signal voltage level to CMOS voltage level), POR3V circuit 32 (detecting Vdd reaching a pre-determined voltage level), and other circuits not shown. These circuits require 3.0 volts for operation. The 3.0 volt source is also supplied to a DC-DC voltage regulator 30 from which a source of 1.8 volts is generated. The 1.8 volt source is then supplied to other parts of the die 10, described hereinabove, such as the flash memory array 100.

It should be noted that in the prior art, when the memory circuit die 10 is operational, power from the externally supplied 3.0 volts is supplied to the portion of the die 10 requiring 3.0 volts and is transformed by the DC-DC regulator and supplied to the 1.8 volt circuits, at all times, even if not all the circuits requiring the power is operational. For example, after the microcontroller 20 has sent address, data and control signals to the flash memory array 100, the microcontroller 20 need not be powered up, and further only the flash array 100 needs to be powered such as during long chip erase operation for flash memory. Or certain circuit blocks (not shown) inside the flash memory 100 need not be powered during certain chip operation such as during erase or programming operation, read circuits can be on standby and during read operation, erase and programming circuits can be on standby. Reducing and/or eliminating power to portions of the circuit in the die 10 that do not require power can reduce the total power requirements of the integrated circuit die 10.

SUMMARY OF THE INVENTION

Accordingly, in the present invention, an integrated circuit die has a first group of die pads for receiving a first voltage, and a second group of die pads for receiving a second voltage, which is less than the first voltage. A first circuit group is operable at the first voltage. A second circuit group is operable at the second voltage. A circuit detects current flow from the second voltage. A voltage regulator transforms the first voltage to the second voltage. In another embodiment, the second voltage is supplied externally. In another embodiment, the first circuit group and the second circuit group receives the second voltage. The circuit for detecting current flow from the second voltage control the voltage regulator in response to the detection of current flow. The invention includes mixed voltage and mixed oxide sensing for optimal power and optimal area.

BRIEF DESCRIPTION OF THE DRAWINGS

FIG. 14 is a detail circuit diagram of an embodiment of an IO Buffer of the present invention.

FIG. 15 are tables showing the operating power using the circuits of the present invention.

DETAILED DESCRIPTION OF THE PREFERRED EMBODIMENT

Figure 1:
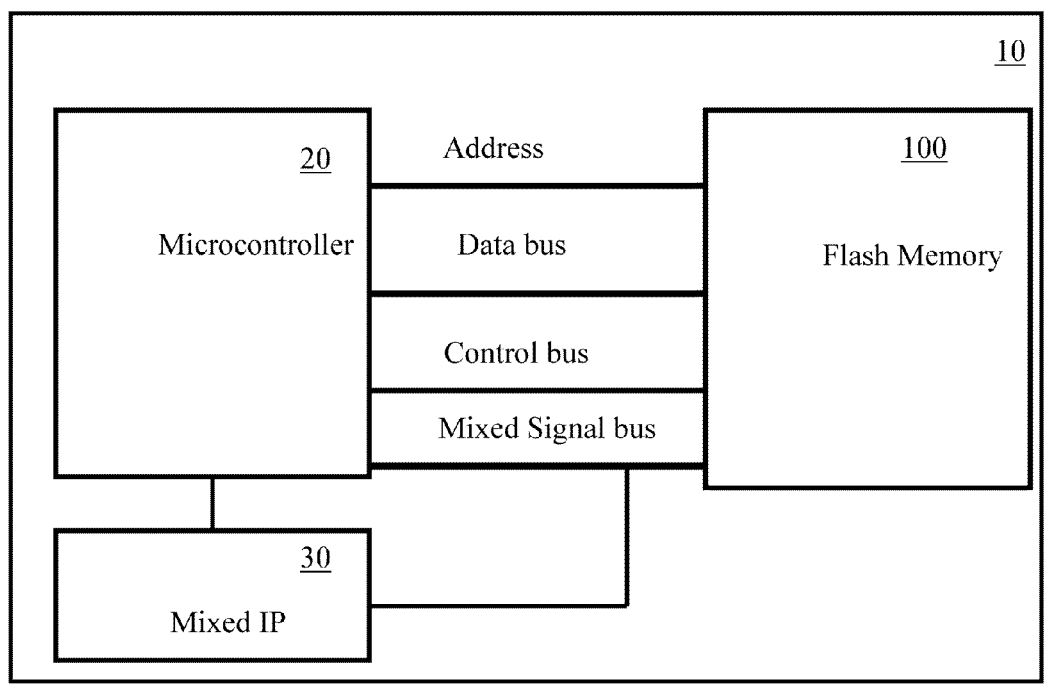
FIG. 1 is a block diagram of a flash memory circuit die of the prior art.
Figure 2:
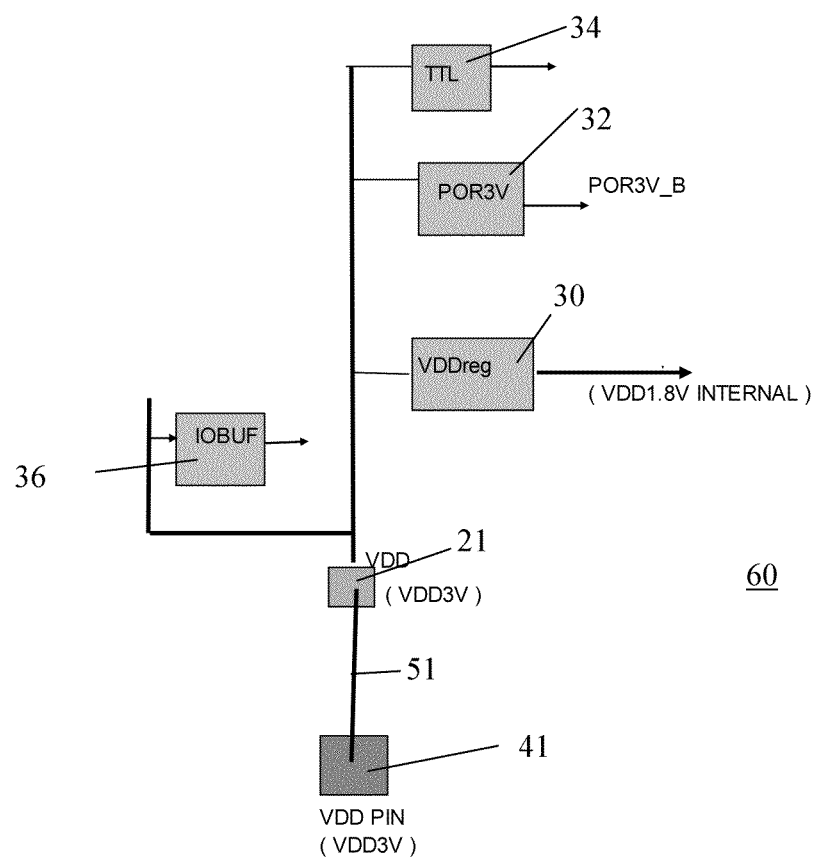
FIG. 2 is a schematic circuit diagram of a portion of the flash memory circuit of the prior art shown in FIG. 1.
Figure 3:
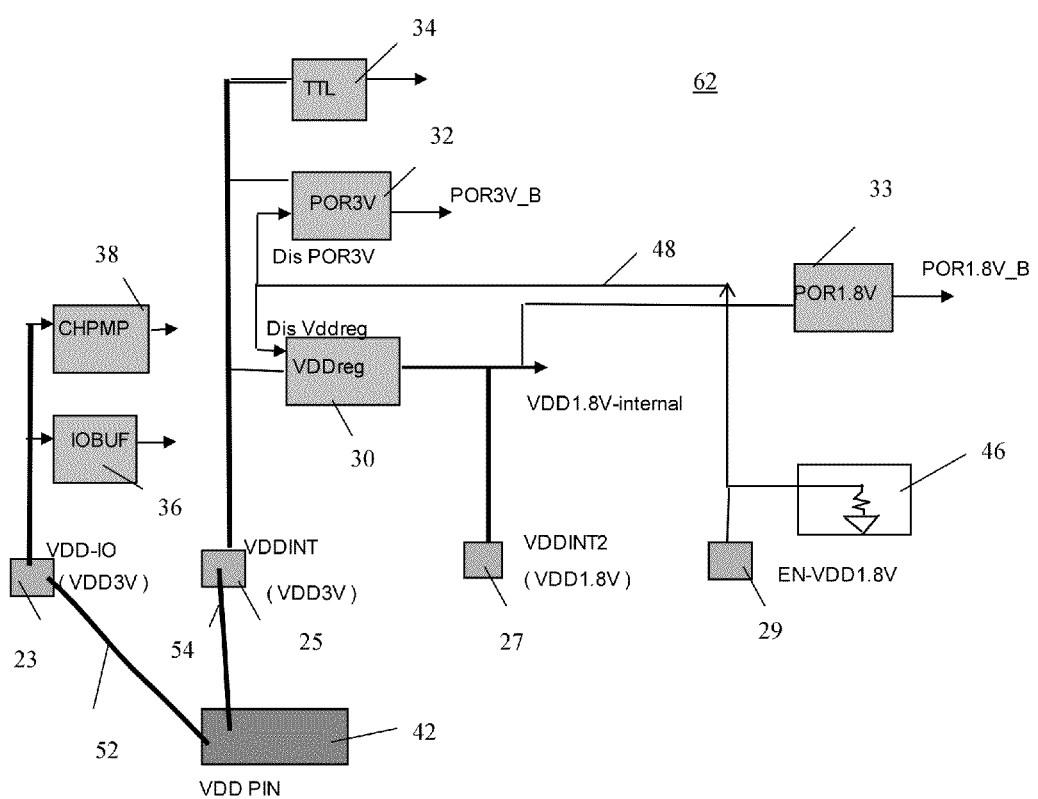
FIG. 3 is a block level schematic diagram of a first embodiment of the circuit of the present invention.

Referring to FIG. 3 there is shown a first embodiment of the circuit 62 of the present invention. The circuit 62 has four (internal) die pads 23, 25, 27, 29. The circuit 62 has one bond pad: 42. Bond pad is an external pad such as a package pad (which connecting to a package pin). Die pad 23 and 25 connect to bond pad 42 through bonding wires (52 & 54). Die pads 23 and 25 receive a first voltage source, Vdd1, of 3.0 volts, although any voltage within 3.0V specification tolerance (such as 2.2V to 4.0V) can be supplied. Die pad 27 receives a second voltage source, Vdd2, of 1.8 volts, which is less than the first voltage source. The Vdd2 is supplied from the DC-DC regulator 30 in this case. Again however, any voltage source within 1.8V specification tolerance (such as 1.2V to 2.0V) can be provided. Die pad 29 is left floating, hence it gets pulled down to ground through the resistor in block 46, in this embodiment.

The voltage from the bond pad 42 is supplied to the IO buffer circuit 36, to the charge pump circuit 38, and to other well known circuits (such as the TTL circuit 34, the POR3V circuit 32), all described heretofore, that require 3.0 volts for operation. In this chip configuration, the 3.0 volt is also supplied to a DC-DC voltage regulator 30 from which a source of 1.8 volts is generated. The 1.8 volt source is then supplied to other parts of the die 10, described hereinabove, such as the flash memory array 100. The current sensing circuit 46 senses no current flow in this case, which generates a control signal 48 in response thereto. The control signal 48 is supplied to the DC-DC voltage regulator 30 and is used to control the operation of the regulator 30, as described hereinbelow. The voltage source Vdd2 is supplied to the internal circuits of the die 10 that requires operation using the voltage Vdd2.

In the operation of the die 10 with the circuit 62 of the present invention, the die 10 must have been designed such that circuits that require the use of voltage source Vdd1 are never on at the same time as the circuits that require the voltage from Vdd2. Thus, 3.0 volt transistors or other circuit elements are operational only at a certain point in time, which is before vdd2 being operational, while transistors and other circuit elements are only operational at other points in time. In that event, assuming that only circuit elements requiring Vdd1 are on, then the externally supplied Vdd1 supplies the voltage Vdd1 to the various circuit elements in the die 10. During that time, the DC-DC voltage regulator 30 is enabled, because the current sensing element 46 does not detect any current flow (die pad 29 is float thus no current supplied to the circuit 46). Thus, the control signal 48 enables the DC-DC regulator 30. When portions of the die 10 requiring a voltage of Vdd2 is activated, the source of the voltage Vdd2 is supplied from the DC-DC regulator 30.

Figure 4:
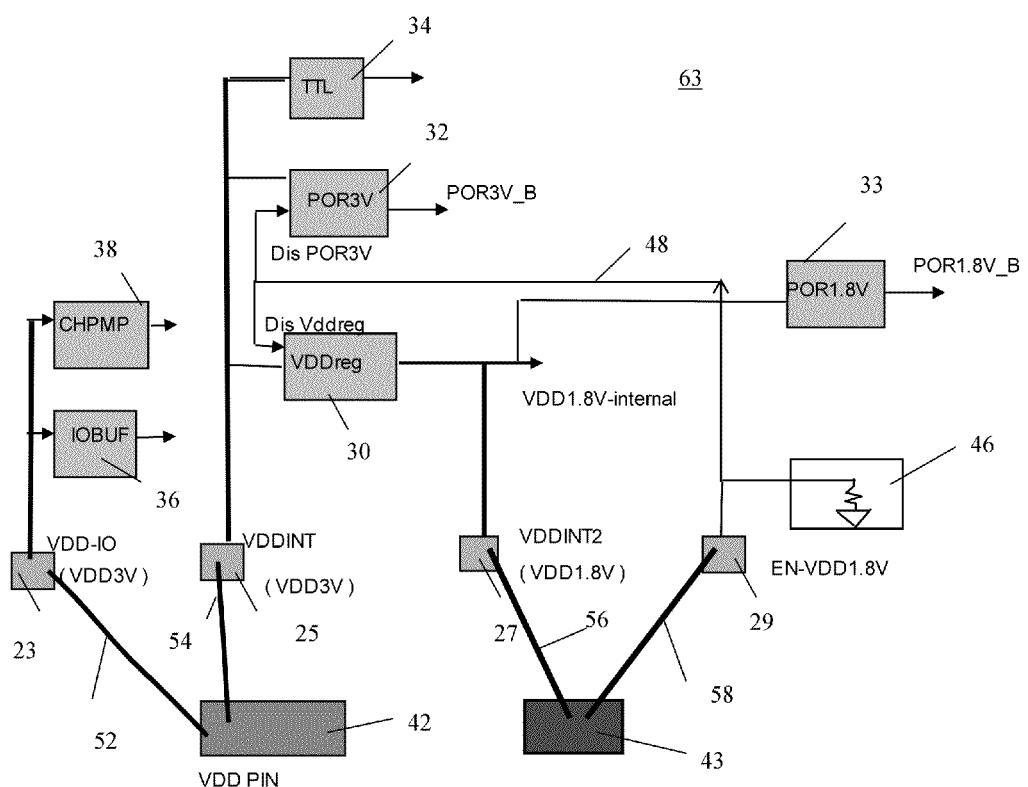
FIG. 4 is a block level schematic diagram of a second embodiment of the circuit of the present invention.

Referring to FIG. 4, there is shown a circuit diagram 63 of a second embodiment of the present invention. Similar to the embodiment shown in FIG. 3, the circuit 63 has four die pads 23, 25, 27, 29 and two bond pad 42 and 43. In this configuration die pads 23 and 25 are connected through bond wires 52 and 54 to the bond pad 42 and die pads 27 and 29 are connected through bond wires 56 and 58 to bond pad 43 respectively. Bond pad 42 receives a first voltage source, Vdd1, of 3.0 volts, although any voltage can be supplied. Bond pad 43 receives a second voltage source, Vdd2, of 1.8 volts, which is less than the first voltage source. Again however, any voltage source can be supplied. The sensing circuit 46 now detects current flow since die pad 29 receives a voltage from bond pad 43. This in turn activates the control signal 48 which disable the DC-DC regulator 30. In this embodiment the 3V circuits operate with the 3.0 volts from the Vdd1 bond pad 42 and the 1.8V circuits operate with 1.8 volts from the Vdd2 bond pad 43.

The voltage from the bond pad 42 is supplied to the IO buffer circuit 36, to the charge pump circuit 38, and to other well known circuits, all described heretofore, that require 3.0 volts for operation. The 1.8 volt source is supplied to other parts of the die 10, described hereinabove, such as the flash memory array 100.

Figure 5:
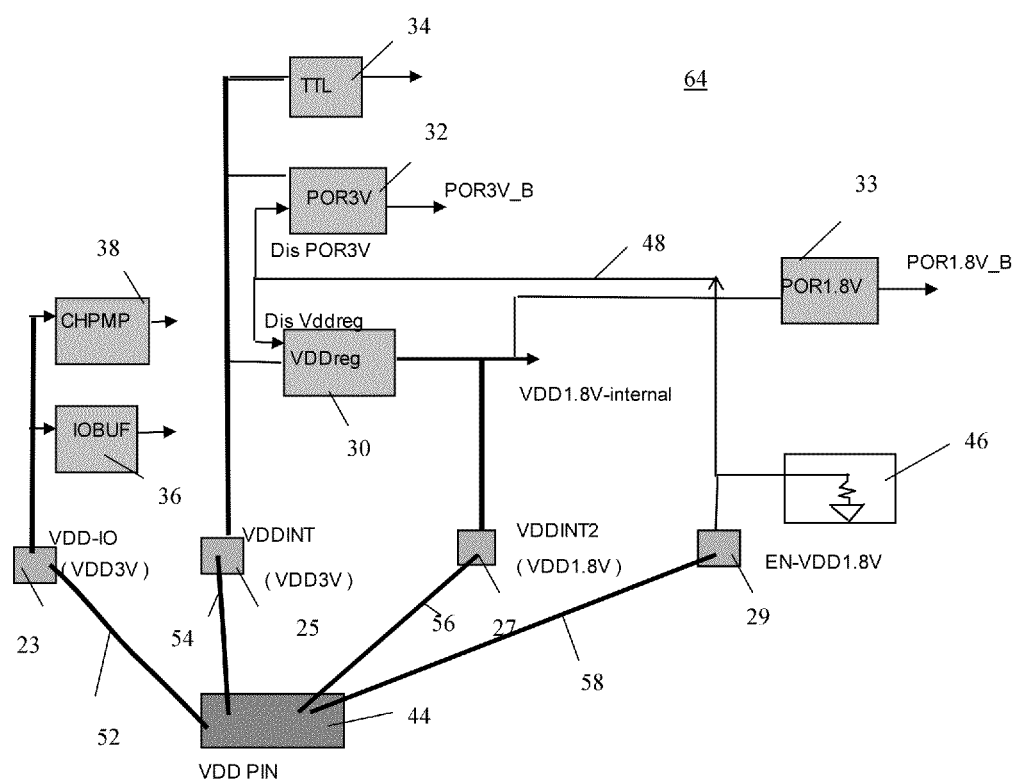
FIG. 5 a block level schematic diagram of a third embodiment of the circuit of the present invention.

Referring to FIG. 5, there is shown a circuit diagram 64 of a third embodiment of the present invention. Similar to the embodiment shown in FIG. 3, the circuit 64 has four die pads 23, 25, 27, 29 and one bond pad 44. In this configuration all die pads 23, 25, 27, and 29 are connected through bond wires 52, 54, 56, and 58 respectively to bond pad 44. Bond pad 44 receives a voltage source, Vdd2, of 1.8 volts externally. The circuit 46 now detects current flow since die pad 29 receives a voltage from bond pad 44. This in turn activates the control signal 48 which disable the DC-DC regulator 30. In this embodiment all the circuits operate with the 1.8 volts from the Vdd2 bond pad 44. In this case the TTL circuit 34, IOBUF circuit 36, and charge pump 38 are to operate at 1.8V supply.

Figure 6:
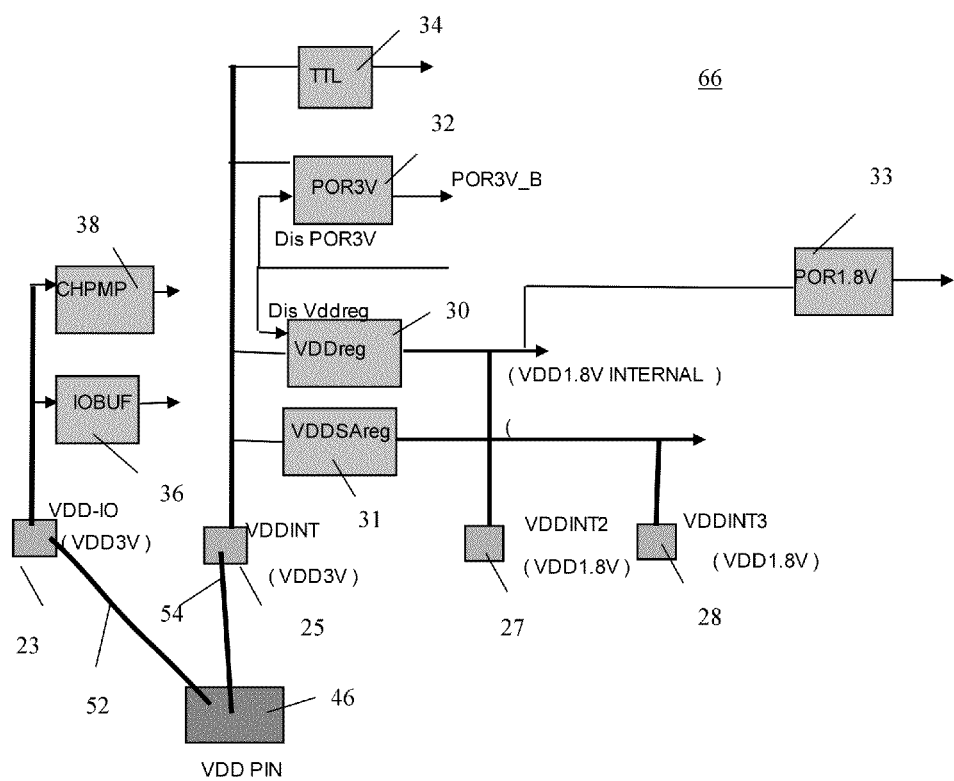
FIG. 6 a block level schematic diagram of a fourth embodiment of the circuit of the present invention.

Referring to FIG. 6, there is shown a circuit diagram 66 of a fourth embodiment of the present invention. Similar to the embodiment shown in FIG. 3, the circuit 64 has four die pads 23, 25, 27, and 28 and one bond pad 46. In this configuration die pads 23 and 25 are connected through bond wires 52 and 54 to bond pad 46. Bond pad 46 receives a voltage source of 3.0 volts from Vdd1.

The voltage from the bond pad 46 is supplied to the IO buffer circuit 36, to the charge pump circuit 38, and to other well known circuits, all described heretofore, that require 3.0 volts for operation. In this chip configuration, the 3.0 volt is also supplied to a DC-DC voltage regulator 30 from which a source of 1.8 volts is generated. The 1.8 volt source is then supplied to other parts of the die 10, described hereinabove, such as the flash memory array 100. The 3.0 volt is also supplied to a DC-DC voltage regulator 31 from which a source of 1.8 volts is generated which is supplied to the sensing circuitry of the flash memory. In this embodiment a configuration bit is used to enable the DC-DC regulator 30 and 31. The configuration bit is supplied by the microcontroller 20 or by an initialization sequence at power up (similar to that described by FIGS. 8 and 9).

In the operation of the die 10 with the circuit 66 of the present invention, the die 10 must have been designed such that circuits that require the use of voltage source Vdd1 are connected to the voltage source Vdd1, while those circuits that are only periodically or intermittently operations using Vdd2 are connected to the first voltage regulator 30. All other circuits that require Vdd2, but which can be on at the same time as circuits that require Vdd1, are connected to the second voltage regulator 31. In particular, the flash array memory cells 100 are connected to the voltage regulator 30, while circuit elements in the sense amplifier that require Vdd2 are connected to the voltage regulator 31.

In this manner, circuit elements that require Vdd2 operation but not at the same time as circuit elements that require Vdd1 operation operate from the regulator 30 as described hereinabove. However, for circuit elements that require voltage source Vdd2 at the same time as Vdd1 is also activated for other circuit elements, the source of Vdd2 is the regulator 31. In this manner, the benefits of power saving as described hereinabove is achieved, even though some circuit elements requiring Vdd2 are operational at the same time as those circuit elements that require Vdd1.

Figure 7:
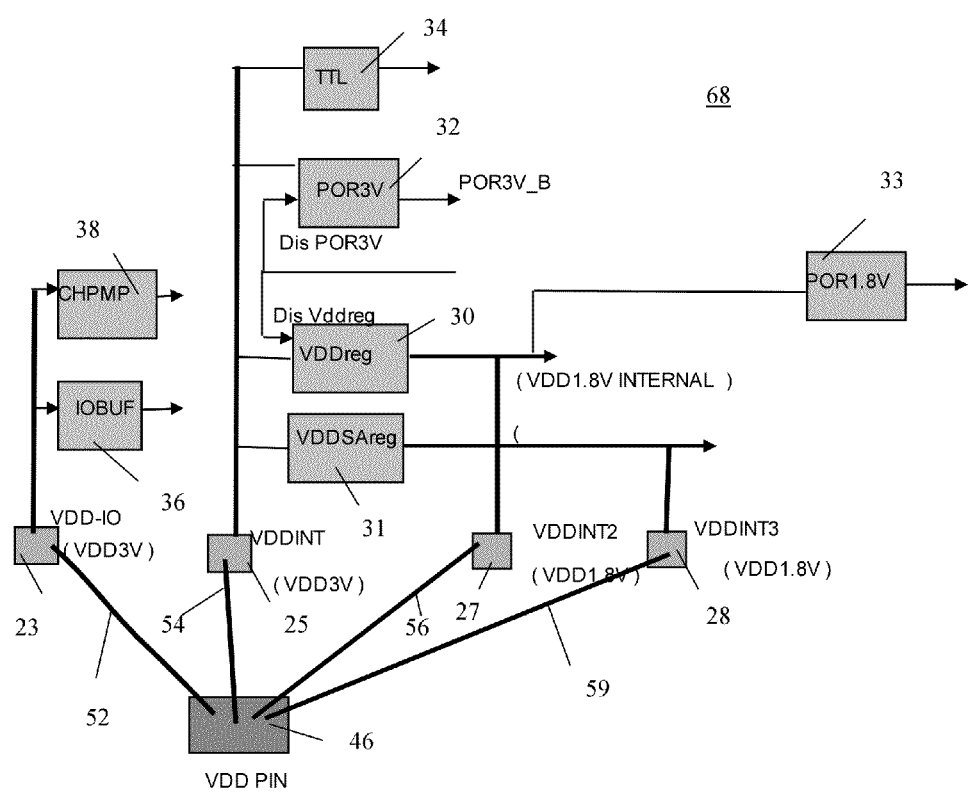
FIG. 7 a block level schematic diagram of a fifth embodiment of the circuit of the present invention.

Referring to FIG. 7, there is shown a circuit diagram 68 of a fifth embodiment of the present invention. Similar to the embodiment shown in FIG. 3, the circuit 64 has four die pads 23, 25, 27, and 28 and one bond pad 46. In this configuration die pads 23, 25, 27, and 28 are connected through bond wires 52, 54, 56, and 59 respectively to bond pad 46. Bond pad 46 receives a voltage source, Vdd2, of 1.8 volts. In this embodiment all circuits need to be operational at 1.8 volts. In this embodiment a configuration bit is used to disable the DC-DC regulator 30 and 31. The configuration bit is supplied by the microcontroller 20 or by a initialization sequence at power up (similar to that described by FIGS. 8 and 9).

Figure 8:
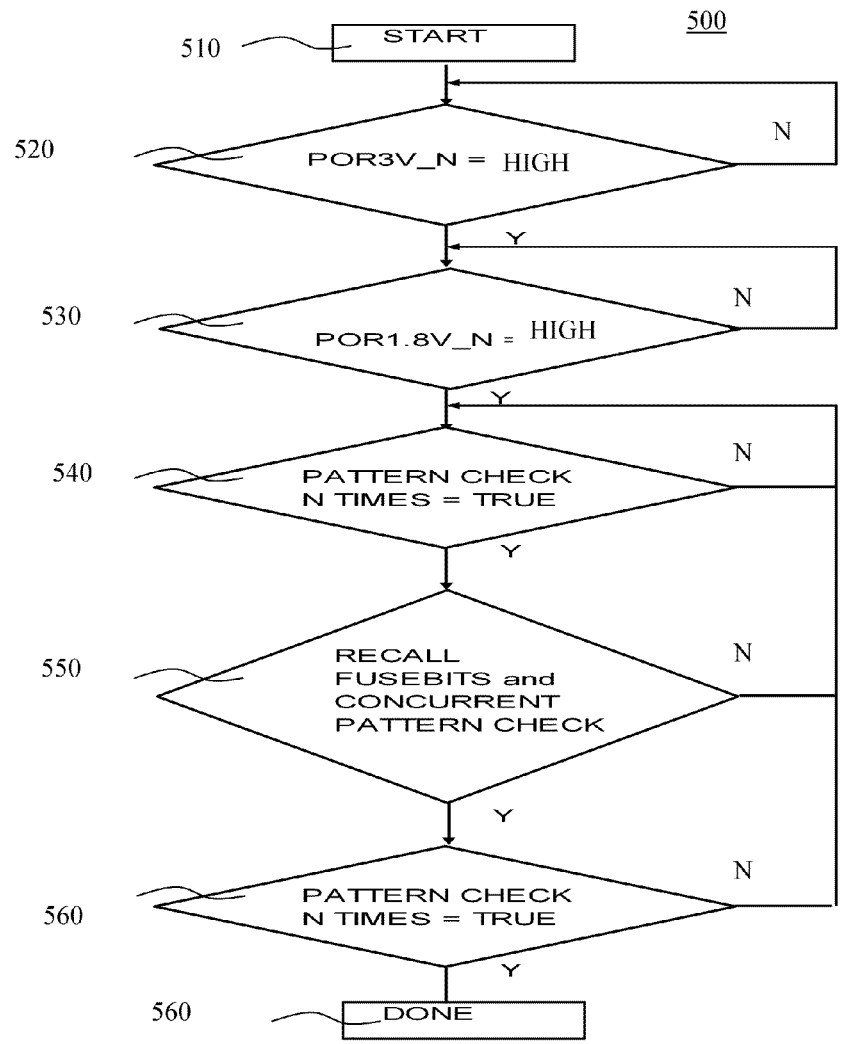
FIG. 8 is mixed power supply power up sequence flow chart

FIG. 8 is a mixed power supply power sequence flow and timing. The fuse bits are used as configuration bits for chip operation. Chip operation includes operations such as various power saving modes and non-volatile operation modes (erase, program, read, testing, etc. . . . ). The power up sequence flow is also called a fusebit recall sequence (or flow). A certain configuration bits are for configuring the die pad connection such as for power supplies 3V and 1.8V. A certain configuration bits are for configuring the circuits such as to work properly with power supplies 3V and 1.8V. At start such as at power up, a 3V power detection circuit is monitored to check if 3V supply is ramp up to a certain trip point (e.g., 2.2V), then a 1.8V power detection circuit is monitored to check if 1.8V supply is ramp up to a certain trip point (e.g., 1.3V). At this point a complementary (inverted data on same patter and on next pattern, such as "1" and "0") fixed pattern check is used to determine if the chip operation is reliable (e.g., reading AAAA/5555/FFFE/0001 data pattern). If the fixed pattern check is true then fuse bits are recalled (configuration bits) to set up chip configurations. A concurrent pattern check (such as A/5 pattern and/or parity bits) is used at the same time recalling the fuse bits to ensure the fuse recalling is reliable. In one embodiment an embedded pattern (such as A/5 pattern and/or parity bit) within each fuse word (e.g., 16 fuse bits for each fuse word) is implemented to ensure fuse recall is reliable. An embodiment is A(Fs<7:0>)5/5(Fs<7:0>A for 16 bits recall, Fs<7:0> is fuse bits, A and 5 are alternating pattern bits for consecutive recalling, Another embodiment is 1(Fs<13:0>)0/0(Fs<13:0>)1 with 1,0 are alternating pattern bits for consecutive recalling. Once the fuse recall is done, the fixed pattern check is used again to ensure again the chip operation is reliable. If this post pattern check is true then the power up recall operation is done. In another embodiment, margining (adapting trip point of sensing or timing adjustment) is done for pattern bits to ensure the pattern bits are worst case for fuse recall operation. In another embodiment, parity bits are done for pattern bits and fuse bits to ensure another layer of reliability check. In another embodiment, multiple memory cells are used for each fuse bit for operational reliability.

Figure 9:
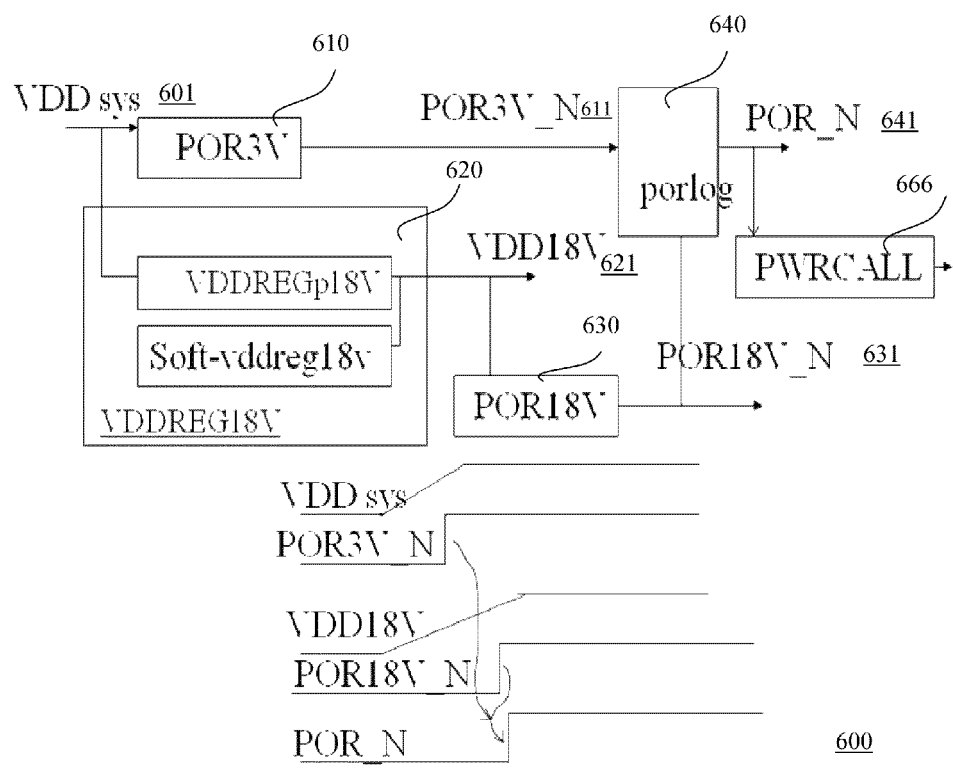
FIG. 9 is a mixed power supply power sequence block diagram and timing

FIG. 9 shows a block diagram 600 of a power sequence controller for power up sequence and fuse bit (configuration bits) recall timing. Block 620 is a DC-DC regulator to provide 1.8V from a 3.0V supply. It consists of a 1.8V LDO (linear regulator VDDREGp 1.8V) and a soft regulator Soft-vddreg 1.8V. The linear regulator VDDREGp 1.8V provides (hard) precise regulation for normal operation. The soft regulator is used to provide approximate 1.2-1.8v during power up when the VDDREGp 1.8V is not operational yet or during power saving mode (smaller voltage level than the level during normal operation). Block 610 POR3V is to provide trip point for 3V Supply. Block 630 POR1.8V is to provide trip point for 1.8V Supply. Block 640 PORLOG is used to provide logic during power up. Block 666 PWRCALL is used to provide fuse recall logic control. The signal sequence is POR3V_N then POR1.8V_N and finally PORN (combing POR3V_N and POR1.8V_N).

TABLE I of FIG. 15 shows a power operating embodiment for the flash chip 100 for further efficient power utilization of the flash chip with operation mode of Standby, Deep Power Down, Read, Program and Erase operation with power supply availability of 3V and 1.8V. the power operating embodiment of various circuit functional blocks are enabled by, for example, configuration bits in the fusebit recall flow of the power sequence. In Standby Mode Vdd (power supply) for sensing circuitry is 0V, Vdd for charge pump (hv circuitry) is 0V, Vdd for Logic Controller is 3V and/or 1.8V, Vdd for x-decoding (aka row decoder) is 3V and/or 1.8V, Vdd for y-decoding circuitry (aka column decoder) is 1.8V and/or 3V, Vdd for IOBUF is 3V, and voltage level for the VDDREG1.8V output is 1.8V (hard (accurate) regulation mode block 620, also hard power level). In Deep Power Down Mode Vdd (power supply) for sensing circuitry is 0V, Vdd for charge pump (hv circuitry) is 0V, Vdd for Logic Controller is either 3V and/or 1.3-1.6V, Vdd for x-decoding (aka row decoder) is 0V, Vdd for y-decoding circuitry (aka column decoder) is 0V, Vdd for IOBUF is 3V, and voltage level for the VDDREG1.8V output is 1.3-1.6V (soft regulation mode block 620 FIG. 9, also soft power level). In Read/Prog/Erase Vdd (power supply) for sensing circuitry is (1.8V and/or 3V)/0V/0V respectively, Vdd for charge pump (hv circuitry) is 0V/3V/3V respectively, Vdd for Logic Controller is 3V and/or 1.8V for Read/Prog/Erase, Vdd for x-decoding (aka row decoder) is 1.8V for Read/Prog/Erase, Vdd for y-decoding circuitry (aka column decoder) is 1.8V and/or 3V for Read/Prog/Erase, Vdd for IOBUF is 3V, and voltage level for the VDDREG1.8V output is 1.8V (hard (accurate) regulation mode block 620 FIG. 9) for Read/Prog/Erase.

TABLE II of FIG. 15 shows a power operating embodiment for the flash chip 100 for further efficient power utilization of the flash chip with operation mode of Standby, Deep Power Down, Read, Program and Erase operation with power supply availability of 1.8V. In Standby Mode Vdd (power supply) for sensing circuitry is 0V, Vdd for charge pump (hv circuitry) is 0V, Vdd for Logic Controller is 1.8V, Vdd for x-decoding (aka row decoder) is 1.8V, Vdd for y-decoding circuitry (aka column decoder) is 0V, Vdd for IOBUF is 1.8V, and voltage level for the VDDREG1.8V output is 1.8V. In Deep Power Down Mode Vdd (power supply) for sensing circuitry is 0V, Vdd for charge pump (hv circuitry) is 0V, Vdd for Logic Controller is 1.8V, Vdd for x-decoding (aka row decoder) is 0V, Vdd for y-decoding circuitry (aka column decoder) is 0V, Vdd for IOBUF is 1.8V, and voltage level for the VDDREG1.8V output is 1.0-1.3V (soft regulation mode block 620 FIG. 9). In Read/Prog/Erase Vdd (power supply) for sensing circuitry is 1.8V/0V/0V respectively, Vdd for charge pump (hv circuitry) is 0V/1.8V/1.8V respectively, Vdd for Logic Controller is 1.8V for Read/Prog/Erase, Vdd for x-decoding (aka row decoder) is 1.8V for Read/Prog/Erase, Vdd for y-decoding circuitry (aka column decoder) is 1.8V for Read/Prog/Erase, Vdd for IOBUF is 1.8V, and voltage level for the VDDREG1.8V output is 1.8V (accurate regulation mode block 620 FIG. 9) for Read/Prog/Erase.

Figure 10:
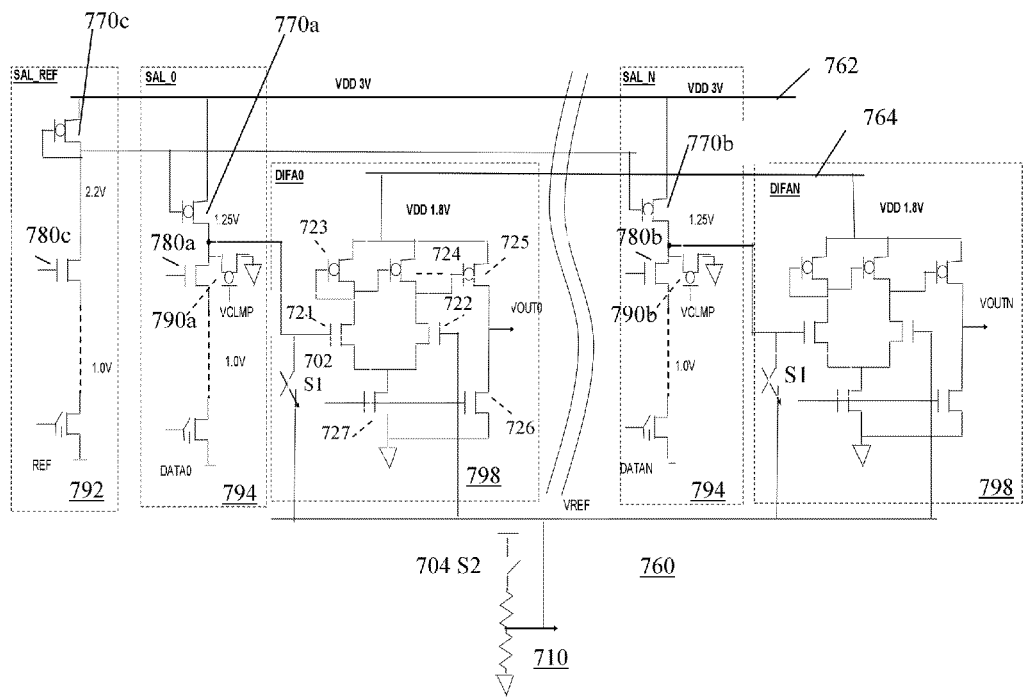
FIG. 10 is a detail circuit diagram of a first embodiment of a sense amplifier using the circuit of the present invention.

Referring to FIG. 10 there is shown a first embodiment of a sense amplifier 760 of the present invention. The sense amplifier 760 is of a Mixed Power Supply Mixed Oxide Pseudo Differential Amplifying scheme. Mixed power supply refers to multiple supplies, e.g. 3 v (or 5V) and 1.8 v and/or 1.2V, being used on same sense amplifier. Mixed oxide refers to multiple oxides (e.g, 3 v (or 5V) and 1.8 v oxides (and/or 1.2V oxide)) being used in same sense amplifier. The sense amplifier 760 receives the voltage Vdd1 of approximately 3.0 volts along the first bus 762, and the voltage Vdd2 of approximately 1.8 volts (or 1.2V alternatively) along the second bus 764. The first bus 762 is connected to PMOS transistors 770(a-c), that belongs to first legs of the sense amplifier (also known as the (memory) read out circuit). The transistors 770(a-c) are also called the pullup (load) transistors of the read out circuit. The first leg of the sense amplifier 760 includes first leg for reference column (SAL REF 792) and data columns (SAL0-N 794) NMOS transistors 780(a-c) serves as cascoding amplifying function for the first leg circuitry. PMOS transistors 790(a-b) serves to clamp the voltage level at sensed output node (drain of transistor 770(a-c)) less than approximately 2V to avoid stressing (or breaking down) the gate oxide of the next leg of the sense amplifier (circuitry connected to bus 764). The second bus 764 is connected to all of the rest of the PMOS transistors in the sense amplifier 760. In one embodiment the transistors 770(*a-c*) that receive the voltage of Vdd1 have thicker (gate) oxides (3V oxide, e.g., 70 Angstrom) than the rest of the transistors that receive the voltage of Vdd2 (1.8V oxide, e.g., 32 Angstrom). In another embodiment the transistors 770(*a-c*) are 1.8V transistors (1.8V oxide) since the voltage drop across its terminals (nodes) are to be operated to be less than a pre-determined voltage, e.g. 2V to avoid breakdown from 1.8V oxide. Similar transistors 780(*a-c*) can be implemented as 3V transistors or 1.8V transistors. In the 1.8 v oxide case, voltage drop across its terminals are to be operated to be less than a pre-determined voltage to avoid breakdown from 1.8V oxide.

The Pseudo Differential Amplifier 760 works as follows. The first leg of the reference column SAL_REF 792 converts the memory cell current into a current mirror by the action of the diode connected PMOS transistor 770*c*, the reference current is now mirrored by the transistor 770*c* (though bias voltage on its drain) into the gate of the PMOS transistors 780(*a-d*) of the data column SAL_0-N 794. By using the 3.0 v (Vdd1) supplied on the first leg of the sense amplifier (also known as the readout circuit), the dynamic operating range of the sense amplifier is much larger compared to that of the 1.8V power supply. The second leg of the sense amplifier, DIFA0-N 798, uses 1.8 v power supply (Vdd2) to convert the sensed node (drain of the transistor 780*d*) into a digital voltage level (output VOUT0-N) '0' or '1' depending on the memory cell current DATA0-N 'high' or 'low' respectively and to accomplish the 3V to 1.8V voltage level conversion at the same times. The second leg DIFA0-N 798 uses 1.8V power supply, hence 1.8 v transistors can be used here (smaller area and higher performance vs. 3 v transistors). The differential amplifier 798, which is made of all 1.8 v transistors, consists of input stage NMOS 721 & 722 and PMOS load 723 & 724 and bias NMOS 727. The second stage consists of PMOS 725 and NMOS 726 to convert into digital output VOUTD. Switches S1 702 is for initialization before sensing. In another embodiment, the input transistors 721 and 722 are 3.0 v transistors instead of 1.8 v transistors, for example, in case the clamp transistors 790(*a-b*) are not used.

The ymux (y decoder) are not shown in FIGS. 10-13 for the sense amplifiers for brevity. The ymux is used to select the memory cell columns (bitlines) to connect the selected memory cells to the sense amplifiers.

Figure 11:
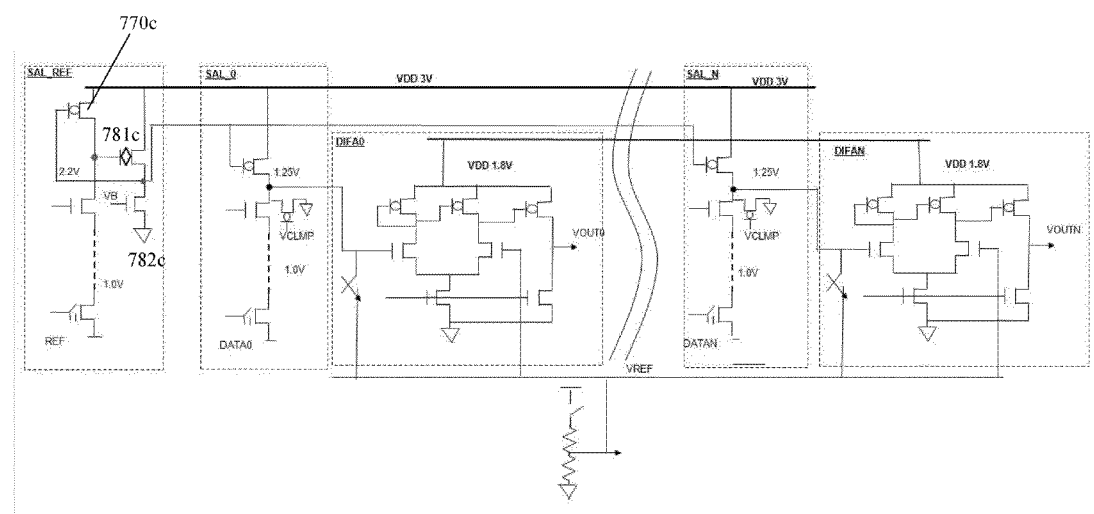
FIG. 11 is a detail circuit diagram of a second embodiment of a sense amplifier using the circuit of the present invention.

Referring to FIG. 11 there is shown a second embodiment of a sense amplifier 761 of the present invention. The sense amplifier 761 is similar to the sense amplifier 760 with the exception of the transistor 781*c* and 782*c* (hence the rest of the transistors are the same). The readout circuit 792 utilizes the transistor 781*c* and 782*c* in a drain-gate-isolation closed loop source follower configuration on the output node (drain of the pullup transistor 770*c* or drain of the cascode transistor 780*c*) to extend the dynamic range of the read out circuit. The drain-gate-isolation refers to isolation of the drain and gate nodes of the pullup load transistor. The transistor 781*c* is native NMOS transistor (approximately zero threshold voltage) serves to isolate the drain and gate of the transistor 770*c*. The drain of the transistor 770*c* now can go higher than its gate voltage allowing for wider dynamic range for the cascoding transistor 780*c* (its drain can go higher voltage than previously). The transistor 782*c* serves as bias current for the transistor 781*c*. The gate of the transistor 770*c* is also the source of the transistor 781*c* (acts as source follower) and effectively this node is now low impedance (meaning can drive higher current, leading to higher speed). This technique can be used for reading out the data cell in addition to reading out the reference cell. This technique can be used on the other sensing circuits in FIGS. 12 and 13.

Figure 12:
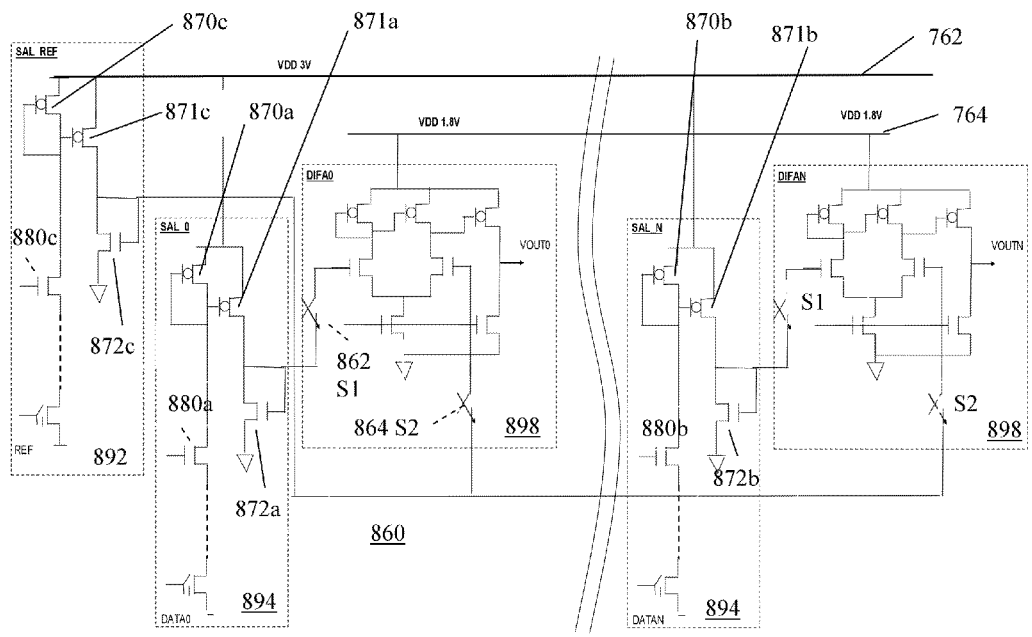
FIG. 12 is a detail circuit diagram of a third embodiment of a sense amplifier using the circuit of the present invention.

Referring to FIG. 12 there is shown a third embodiment of a sense amplifier 860 of the present invention. The sense amplifier 860 is of a Differential Amplifying scheme. The sense amplifier 860 receives the voltage Vdd1 of approximately 3.0 volts along the first bus 762, and the voltage Vdd2 of approximately 1.8 volts along the second bus 764. The first bus 762 is connected to PMOS transistors 870(*a-c*) and 871(*a-c*). The second bus 764 is connected to all of the rest of the PMOS transistors in the sense amplifier 860. The transistors 870(*a-c*) and 871(*a-c*) that receive the voltage of Vdd1 have thicker oxides than the rest of the transistors that receive the voltage of Vdd2. The Differential Amplifier 860 works as follows. The first leg of the sense amplifier includes first leg for reference column (SAL REF 892) and data columns (SAL0-N 894) NMOS transistors 880(*a-c*) serves as cascoding amplifying function for the first leg circuitry. PMOS transistors 870(*a-c*)_serves as pullup loading and mirror cell current into PMOS transistors 871(*a-c*) and these currents are then converted into out voltages by (diode-connected) NMOS transistors 872(*a-c*). The reference cell voltage and data cell voltage are then compared by the differential amplifiers 898 to convert into a digital output VOUTD. Similarly as in sense amplifier 760, by partitioning the sense amplifier into the readout circuit (892, 894) operating at 3V resulting into higher dynamic range and a differential amplifier (898) operating at a lower voltage (e.g., 1.8V) resulting into smaller area and higher speed.

Figure 13:
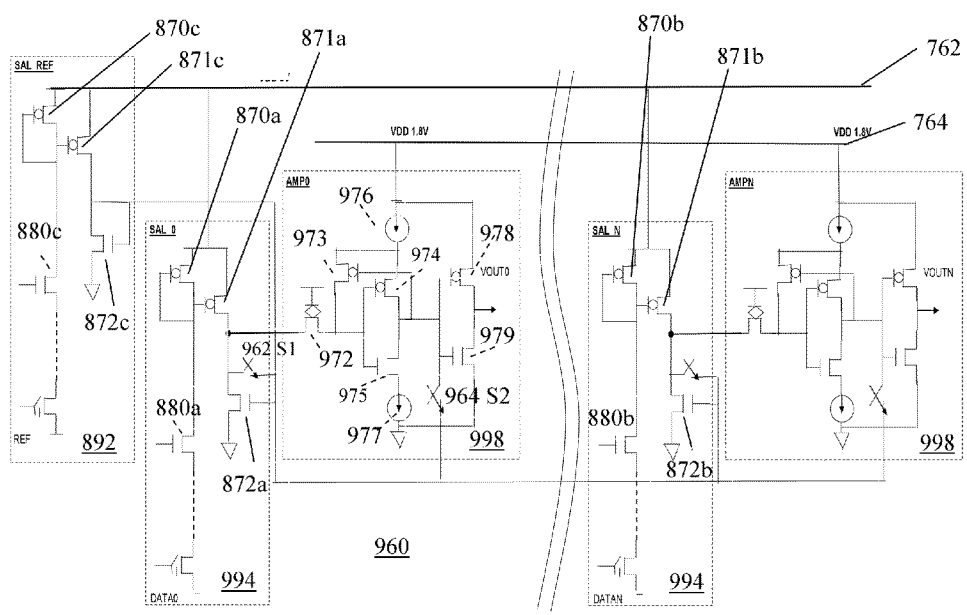
FIG. 13 is a detail circuit diagram of a fourth embodiment of a sense amplifier using the circuit of the present invention.

Referring to FIG. 13 there is shown a fourth embodiment of a sense amplifier 960 of the present invention. The sense amplifier 960 is of a Single Ended Amplifying scheme. The sense amplifier 960 receives the voltage Vdd1 of approximately 3.0 volts along the first bus 762, and the voltage Vdd2 of approximately 1.8 volts along the second bus 764. The first bus 762 is connected to PMOS transistors 870(*a-c*) and 871(*a-c*). The second bus 764 is connected to all of the rest of the PMOS transistors in the sense amplifier 960. The transistors 870(*a-c*) and 871(*a-c*) that receive the voltage of Vdd1 have thicker oxides than the rest of the transistors that receive the voltage of Vdd2. The Sense Amplifier 960 works as follows. The first leg of the sense amplifier includes first leg for reference column (SAL REF 892) and data columns (SAL0-N 994) NMOS transistors 880(*a-c*) serves as cascoding amplifying function for the first leg circuitry. PMOS transistors 870(*a-c*) serves as pullup loading and mirror cell current into PMOS transistors 871(*a-c*). The reference cell current is then converted into reference voltage by NMOS transistors 872*c*. This reference cell voltage then mirror the cell current into the transistor 872*a* of the data column 994. This mirrored reference cell current is than compared versus the data cell current from transistor 871*a*. The current comparison output is the drain voltage of the transistor 871*a*. This output voltage is then amplifier by the single ended amplifier 998 into digital output VOUTD. The single ended amplifier 998 consists of first stage of PMOS transistor 974 and NMOS 975 with current bias 976 and 977 respectively. PMOS 973 is weak feedback transistor. NMOS 972 is isolation transistor isolating 3V from 1.8V voltage. The second stage consists of PMOS 978 and NMOS 979. Switches 962 S1 and 964 S2 are for initialization before sensing. The advantage of the sense amplifier 960 is higher dynamic range for readout circuit 892, and 994 and smaller area and power for single ended amplifier 998 (versus sense amplifier 860 and 760 having differential amplifier on the second leg).

Referring to FIG. 14 there is shown a detailed schematic circuit diagram of an IO Buffer circuit 1000. The circuit 1000 comprises an IO predriver circuit 1010, and two driver circuits 1020*a* and 1020*b*. The predriver circuit 1010 receives the data output 1002 from the memory cell(s) and directs the signal to either the output driver circuit 1020*a* or the output driver circuit 1020*b*. Switches 1004(*a-c*) route the data output signal 1002 to either the driver circuit 1020*a* or driver circuit 1020*b*. The difference between the driver circuit 1020*a* and driver circuit 1020*b* is that the driver circuit 1020*a* is powered by 3.0 volts while the driver output circuit 1020*b* is powered by 1.8 volts. Having separate read paths for 3.0 volt and 1.8 volts optimizes read performance since the 3.0V and 1.8V circuits operate optimally at 3.0V and 1.8V respectively. The 3V or 1.8V read path is enabled depending on the desired 3V or 1.8V output from the product specification. In addition, the 3.0 volt driver circuit 1020*a* serves as an ESD protection circuit for the 1.8 volt driver circuit 1020*b*.

What is claimed is:

1. An integrated circuit flash memory system comprising:
   a memory flash array;
   a first die pad receiving a first voltage;
   a first circuit connected to the first die pad;
   a second die pad receiving a second voltage;
   a second circuit connected to the second die pad; and
   a power sequence controller to provide configuration bits to configure the first circuit in response to a voltage from a first power supply exceeding a first voltage threshold during a power up sequence, the second circuit in response to a voltage from a second power supply exceeding a second voltage threshold during the power up sequence, and the connections of the first die pad and the second die pad.

2. The system of claim 1, wherein the controller is configured to provide the configuration bits during the power up sequence.

3. The system of claim 2, wherein said power up sequence includes concurrent pattern checking.

4. The system of claim 1, wherein said configuration bits control different power saving modes for erase, program, read, standby, and deep power down with hard and soft regulation power level for the first circuit and the second circuit.

5. An integrated circuit flash memory system comprising:
   a bond pad for receiving a first voltage;
   a first die pad coupled to the bond pad;
   a first circuit coupled to the first die pad, the first circuit comprising a voltage regulator for receiving the first voltage and generating a second voltage as an output, wherein the second voltage is lower than the first voltage;
   a second die pad coupled to the output of the voltage regulator;
   a second circuit coupled to the second die pad and the output of the voltage regulator, the second circuit comprising a memory flash array; and
   a controller for enabling the voltage regulator in response to detection of current flow from the second die pad to the second circuit.

6. The system of claim 5, wherein the first voltage is 3.0 volts.

7. The system of claim 6, wherein the second voltage is 1.8 volts.

8. The system of claim 5, wherein the voltage regulator comprises a DC-DC regulator.

9. The system of claim 8, wherein the first circuit comprises an TO buffer circuit.

10. The system of claim 9, wherein the first circuit comprises a charge pump circuit.

11. The system of claim 5, wherein the controller is configured to provide a configuration bit to enable the voltage regulator.

12. The system of claim 5, wherein the controller is configured to perform a power-up sequence.

13. The system of claim 12, wherein the controller is configured to perform a fixed pattern check during the power-up sequence.

14. A method of controlling a flash memory system, comprising:
   generating, by a controller, a configuration bit;
   enabling a voltage regulator using the configuration bit;
   receiving, by the voltage regulator, a first voltage from a first die pad; and
   providing, by the voltage regulator, a second voltage to a second die pad and a flash memory array, wherein the second voltage is lower than the first voltage;
   wherein the generating step occurs in response to the detection of current flow from the second die pad to a circuit coupled to the second die pad.

15. The method of claim 14, wherein the first voltage is 3.0 volts.

16. The method of claim 15, wherein the second voltage is 1.8 volts.

17. The method of claim 14, wherein the voltage regulator comprises a DC-DC regulator.

18. The method of claim 14, further comprising: performing, by the controller, a power-up sequence.

19. The method of claim 18, wherein the performing step comprises: performing, by the controller, a fixed pattern check.

20. The method of claim 18, wherein the performing step comprises: monitoring, by the controller, the status of the first voltage.

* * * * *